(12) United States Patent
Watabe et al.

(10) Patent No.: US 9,780,307 B2
(45) Date of Patent: Oct. 3, 2017

(54) METHOD OF MANUFACTURING A DISPLAY DEVICE

(71) Applicant: Japan Display Inc., Minato-ku (JP)

(72) Inventors: Kazufumi Watabe, Minato-ku (JP); Hiroshi Kawanago, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/377,128

(22) Filed: Dec. 13, 2016

(65) Prior Publication Data

US 2017/0179386 A1     Jun. 22, 2017

(30) Foreign Application Priority Data

Dec. 21, 2015 (JP) ................ 2015-248894
Jan. 27, 2016 (JP) ................ 2016-013147

(51) Int. Cl.
| | | |
|---|---|---|
| *H01L 21/00* | (2006.01) | |
| *H01L 51/00* | (2006.01) | |
| *H01L 51/52* | (2006.01) | |
| *H01L 27/32* | (2006.01) | |

(52) U.S. Cl.
CPC ........ *H01L 51/003* (2013.01); *H01L 27/3293* (2013.01); *H01L 51/0097* (2013.01); *H01L 51/5253* (2013.01); *H01L 27/3244* (2013.01); *H01L 2227/323* (2013.01)

(58) Field of Classification Search
USPC .......................................... 438/28
See application file for complete search history.

(56) References Cited

U.S. PATENT DOCUMENTS 6,476,415 B1 *  11/2002  Walker ............ G02F 1/133351
                                                              257/59
2013/0109116 A1 *  5/2013  Cavuoti ................ C03C 15/02
                                                              438/27

FOREIGN PATENT DOCUMENTS

JP          7-201279         8/1995

* cited by examiner

*Primary Examiner* — Timor Karimy
(74) *Attorney, Agent, or Firm* — Oblon, McClelland, Maier & Neustadt, L.L.P.

(57) ABSTRACT

A glass substrate that corresponds to a plurality of product regions and a first grid region that surrounds each of the plurality of product regions and is grid-like is prepared. A protective film that is harder than the glass substrate is formed in the first grid region. A resin layer is formed so as to cover the protective film and the glass substrate. A part of the resin layer is removed by blast processing in a second grid region that avoids the plurality of product regions, overlaps with the first grid region and surrounds each of the plurality of product regions. A circuit layer is formed on the resin layer. The glass substrate is cut along lines that pass through the second grid region where the part of the resin layer is removed. The glass substrate is peeled off from the resin layer.

13 Claims, 11 Drawing Sheets

METHOD OF MANUFACTURING A DISPLAY DEVICE

CROSS-REFERENCE TO RELATED APPLICATION

The present application claims priority from Japanese applications JP2015-248894 filed on Dec. 21, 2015, and JP2016-013147 filed on Jan. 27, 2016, the contents of which are hereby incorporated by reference into this application.

BACKGROUND OF THE INVENTION

1. Field of the Invention

The present invention relates to a method of manufacturing a display device.

2. Description of the Related Art

On a flexible display, since a rigidity of a resin layer where a functional layer such as a pixel circuit and a color filter layer is formed is small, a manufacturing process is proceeded in a configuration where the resin layer that becomes a base material such as polyimide is disposed on a glass substrate.

Further, in a manufacturing process of a display device where a thin film transistor is formed on a glass substrate, it is known that glass substrates that are laminated to each other are scratched on the front side and the back side with a scribe cutter, and by asserting a stress on the scratched parts the glass substrates are cut into individual pieces of panel.

Note that JPH07-201279A describes a manufacturing method with high efficiency of a PDP substrate that provides a high quality display device with no variation in light emission luminance and an operation voltage.

Now, in the case where a substrate is cut into individual pieces of panel in a manufacturing process of a flexible display, as in the case of a display device where a thin film transistor is formed on a glass substrate, if one tries to cut the substrate after the substrate is scratched by a scribe cutter, the substrate can be hardly cut due to a high viscosity of the resin layer, and thus the yield is degraded.

Further, in the case where glass substrates are cut into pieces using a laser and a scribe cutter in a configuration where resin layers that work as two base materials supported by the glass substrates are laminated to each other, a sublimate arises from the resin layers due to an irradiation of the laser on the resin layers along a part to be cut for trimming, and this sublimate is reattached to the area around the cut part, which degrades the quality.

SUMMARY OF THE INVENTION

It is an object of the present invention in view of the above problems to provide a method of manufacturing a display device where the degradation of the yield caused by the process of cutting the resin layers that are the base material for forming a functional layer into individual pieces is prevented.

In view of the above problems, a method of manufacturing a display device according to the present invention includes steps of: preparing a glass substrate that corresponds to a plurality of product regions and a first grid region that surrounds each of the plurality of product regions and is grid-like; forming a protective film that is harder than the glass substrate at least in the first grid region; forming a resin layer continuously so as to cover the protective film and overlap with the plurality of product regions and the first grid region; removing a part of the resin layer by blast processing in a second grid region that avoids the plurality of product regions, overlaps with the first grid region and surrounds each of the plurality of product regions; forming a circuit layer that includes a circuit to control a luminance of each of a plurality of unit pixels that constitute an image on the resin layer; cutting the glass substrate along lines that pass through the second grid region where the part of the resin layer is removed so as to separate each of the plurality of product regions; and peeling the glass substrate off from the resin layer.

DETAILED DESCRIPTION OF THE INVENTION

Below, a method of manufacturing display devices according to respective embodiments of the present invention is described with reference to the accompanying drawings.

First Embodiment

Figure 1:
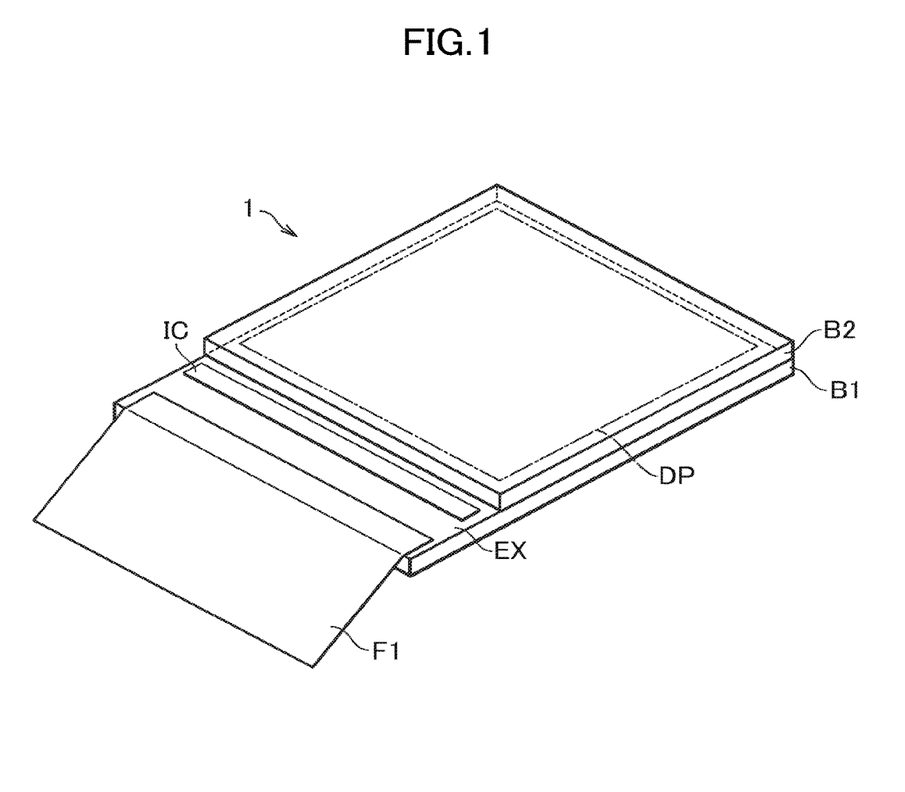
FIG. 1 is a schematic oblique view of a display device according to a first embodiment.

FIG.1 is a schematic oblique view to illustrate a display device 1 manufactured by a first embodiment of the method of manufacturing.

The display device 1 of this embodiment is configured that an opposing resin layer B2 is laminated onto a resin layer B1 on which organic electroluminescence elements as a plurality of light emitting elements are disposed, and a flexible printed substrate F1 and a driver semiconductor device IC are disposed on a region of the resin layer B1 that is not covered by the opposing resin layer B2 (an exposed region EX).

Figure 2:
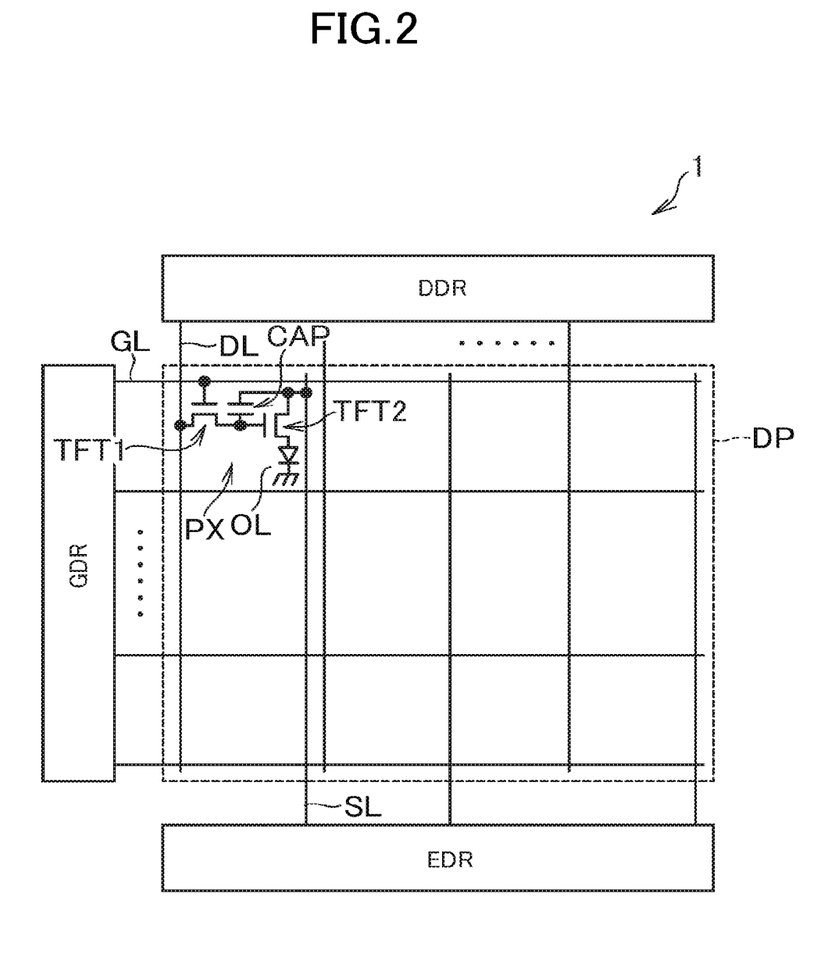
FIG. 2 is a schematic view illustrating a pixel circuit of the display device according to the first embodiment.

FIG. 2 is a view illustrating a pixel circuit in a display region DP of the display device 1 manufactured by the method of manufacturing according to the first embodiment. The display device 1 is provided with the display region DP where an image is displayed, a scanning signal line driving unit GDR, a video signal line driving unit DDR, and an electric power driving unit EDR.

In the display region DP, a plurality of pixel circuits PX that control a luminance to display an image are disposed in a matrix arrangement, and an organic electroluminescence element (a light emitting element) OL is disposed in correspondence with each pixel. The pixel circuit PX is constituted by a thin film transistor TFT1, a capacitive element CAP, and a thin film transistor TFT2. The scanning signal line driving unit GDR, the video signal line driving unit DDR, and the electric power driving unit EDR control a light emission of the organic electroluminescence element OL by driving the pixel circuit PX.

The scanning signal line driving unit GDR is connected to a scanning signal line GL provided for each array of pixels oriented horizontally (a pixel row), and outputs a scanning signal to the scanning signal line GL selected in order.

The video signal line driving unit DDR is connected to a video signal line DL provided for each array of pixels oriented vertically (pixel columns), and outputs, in accordance with a selection of the scanning signal line GL by the scanning signal line driving unit GDR, a voltage corresponding to a video signal of the selected pixel row to each video signal line DL. The voltage is written into the capacitive element CAP inside the pixel circuit PX, and a current in correspondence with the written voltage is supplied to the organic electroluminescence element OL.

The electric power driving unit EDR is connected to a driving electric power line SL provided for each pixel column, and supplies a current to the organic electroluminescence element OL via the thin film transistor TFT2 in the pixel circuit PX.

Figure 3A:
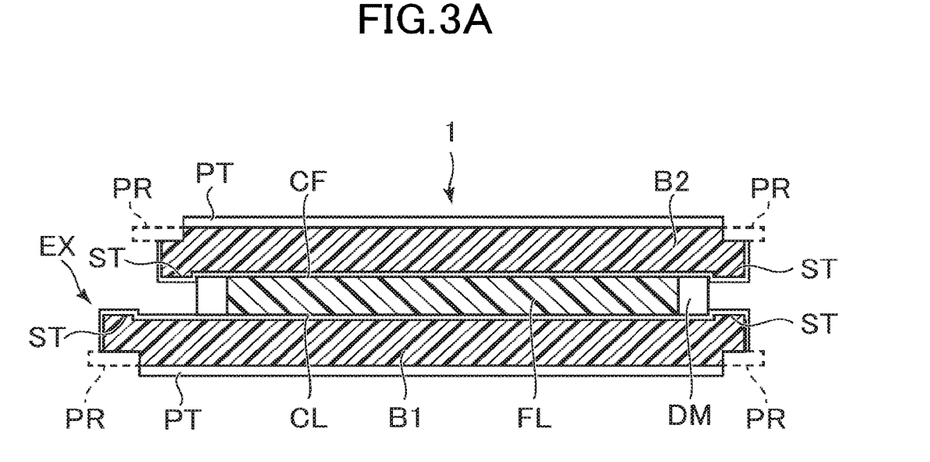
FIG. 3A is a view illustrating a lengthwise cross section of the display device according to the first embodiment.
Figure 3B:
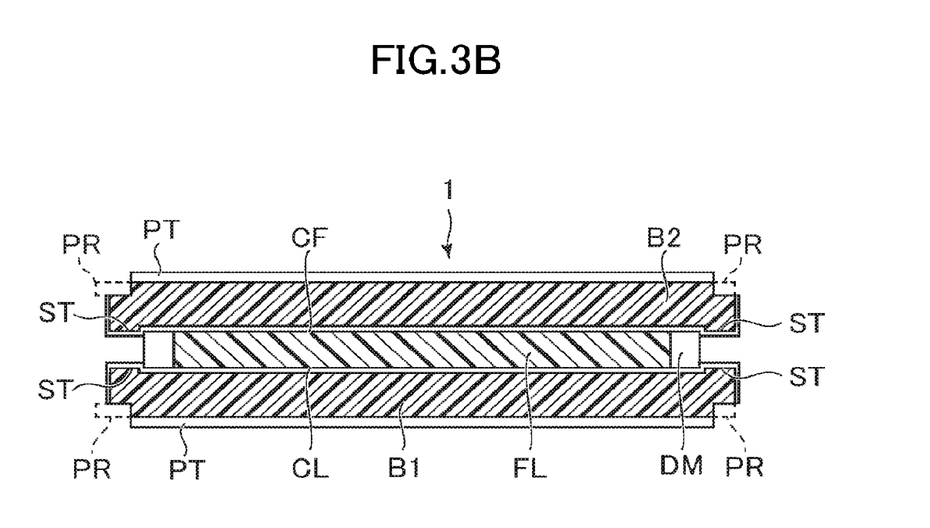
FIG. 3B is a view illustrating a widthwise cross section of the display device according to the first embodiment.

FIG. 3A is a view illustrating a lengthwise cross section including the exposed region EX of the display device 1 manufactured by the method of manufacturing according to this embodiment, and FIG. 3B is a view illustrating a widthwise cross section that perpendicularly intersects the lengthwise cross section. As illustrated in these figures, the display device 1 manufactured by the method of manufacturing according to this embodiment is configured by laminating the resin layer B1 and the opposing resin layer B2 to each other, where the resin layer B1 is a layer on which a circuit layer CL including a circuit to control each of a plurality of unit pixels is formed and the material of which is polyimide and the opposing resin layer B2 is a layer on which a color filter layer CF is formed and the material of which is polyimide. Between the resin layer B1 and the opposing resin layer B2 that are base materials, a filling material FL and a sealing material DM are interposed, and on the external sides of the resin layer B1 and the opposing resin layer B2 protective films PT are arranged.

Particularly in the method of manufacturing the display device 1 according to this embodiment, before laminating the resin layer B1 and the opposing resin layer B2 to each other, trimming of the resin layer B1 and the opposing resin layer B2 by a blast is performed to separate product regions for improving the throughput yield, and in order to prevent cracking of a glass substrate G1 and an opposing glass substrate G2 by this blast, a protective film PR (a protective film PR on the side of the opposing film B2 is hereinafter referred to as an opposing protective film) is formed in correspondence with a grid region where the trimming is performed. In some cases this protective film PR remains on the resin layer B1 or the like of the display device 1 and in other cases it does not. A detailed description on that will be given later.

Further, as illustrated in FIGS. 3A and 3B, protrusion portions ST that protrude toward the side of the filling material FL along the peripheral portion are formed on the resin layer B1 and the opposing resin layer B2, and the protrusion portions ST are provided so as to surround the external side of the sealing material DM. These protrusion portions ST are generated by bumps due to a thickness of the protection film PR formed to seclude the resin layer B1 and the like on the glass substrate G1, and by arranging the sealing material DM to not overlap with the protrusion portions ST and to be inside on the plane, it is configured that occurrence of display unevenness is prevented. A detailed description of these protrusion portions ST will be given later as well.

Figure 4A:
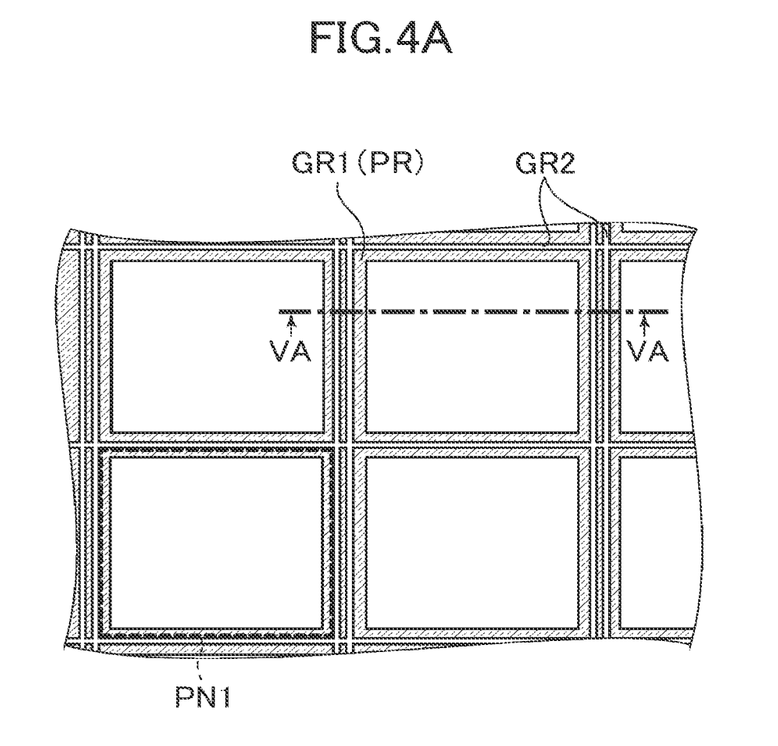
FIG. 4A is a schematic planar view illustrating a mother glass substrate in a manufacturing process of the display device according to the first embodiment.
Figure 4B:
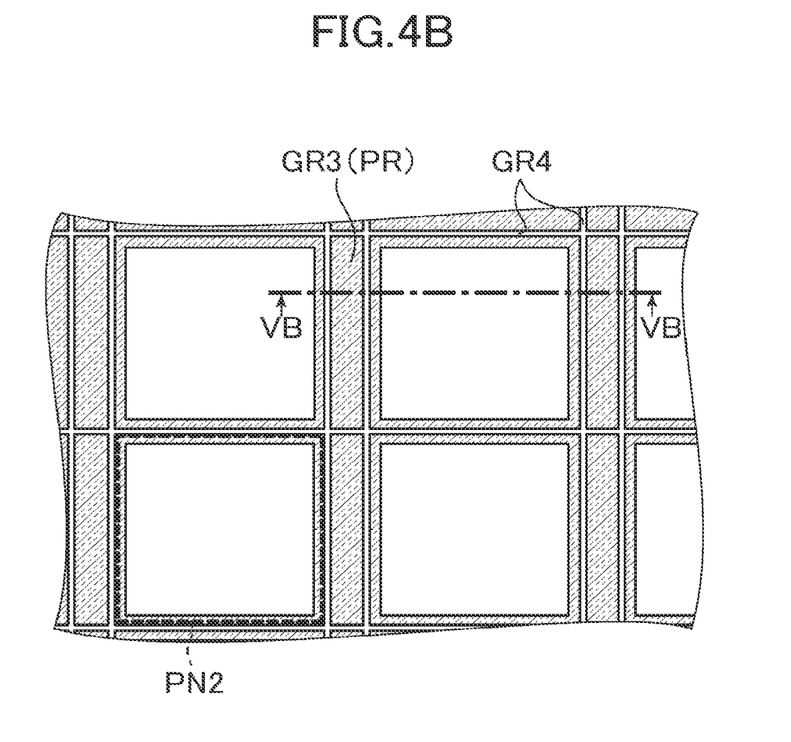
FIG. 4B is a schematic planar view illustrating a mother glass substrate in the manufacturing process of the display device according to the first embodiment.

FIGS. 4A and 4B are views illustrating a manufacturing process of the display device according to this embodiment, and illustrate the states after the resin layer B1 and the opposing resin layer B2 are formed on the glass substrate G1 and the opposing glass substrate G2 but before the circuit layer CL and the color filter layer CF are formed. In FIGS. 4A and 4B, the protective film PR is formed so as to be grid-like in hatched regions, and trimming lines by blast processing are provided (a second grid region GR2, and a second opposing grid region GR4) so as to overlap with the regions where that protective film PR is formed (a first grid region GR1, and a first opposing grid region GR3). Specifically, as illustrated in FIG. 4A, on the glass substrate G1, the protective film PR is formed in the first grid region GR1 that is grid-like so as to be in accordance with each of product regions PN1, and in the second grid region GR2 that overlaps with that protection film PR and surrounds each of the product regions PN1, trimming is performed by the blast processing. Further, similarly, as illustrated in FIG. 4B, on the opposing glass substrate G2, the protective film PR is formed in the first opposing grid region GR3 that surrounds each of opposing product regions PN2 to be grid-like, and in the second opposing grid region GR4 that overlaps with that protection film PR and surrounds each of the opposing product regions PN2, trimming is performed by the blast processing.

The regions where the protective film PR is formed (the first grid region GR1 and the first opposing grid region GR3) correspond to the hatched regions in FIGS. 4A and 4B, and the product regions PN1 and the opposing product regions PN2 correspond to regions inside the trimming lines (the second grid region GR2 and the second opposing grid region GR4) of the blast processing, and thus extended portions that are parts of the product regions PN1 and the opposing product regions PN2 overlap with the protection film PR. Parts that are not included in the product regions PN1 and the opposing product regions PN2 are to be removed in a cutting process after the lamination.

Figure 5A:
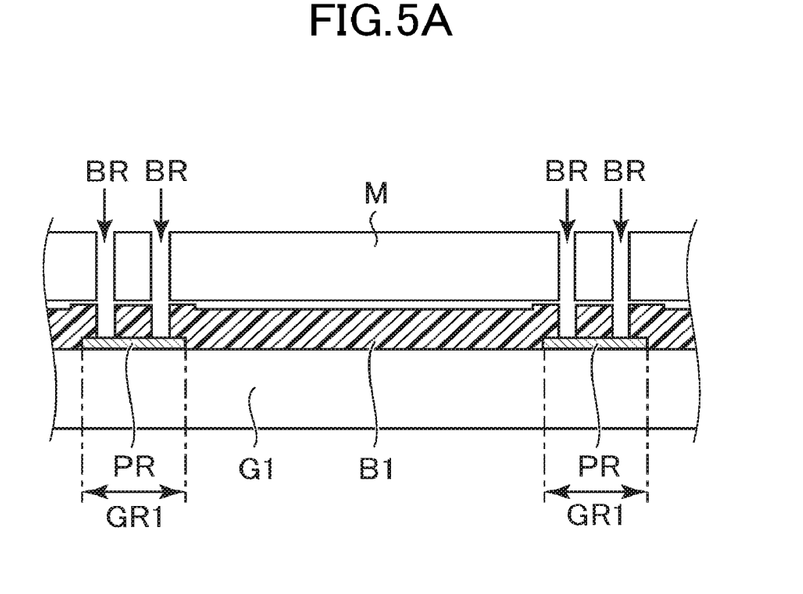
FIG. 5A is a view illustrating VA-VA cross section in FIG. 4A.
Figure 5B:
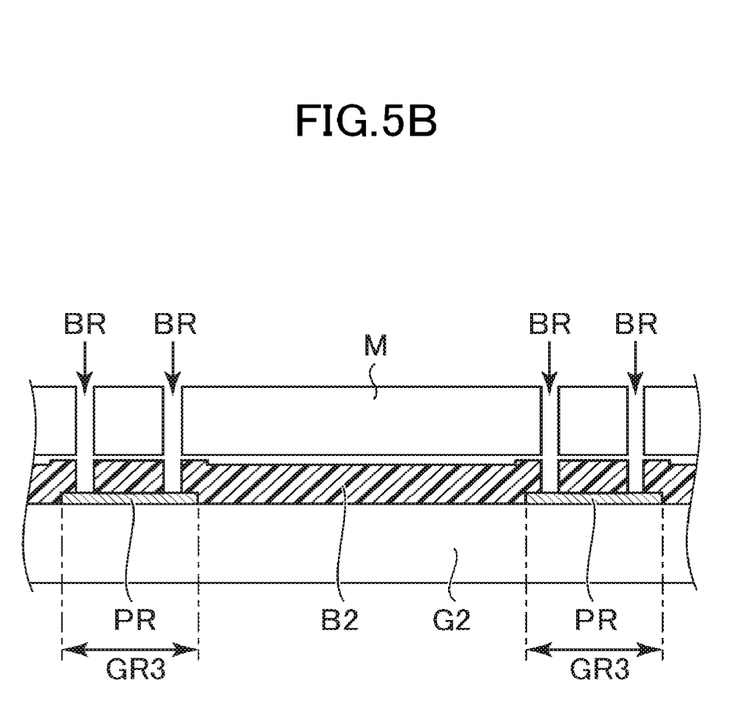
FIG. 5B is a view illustrating VB-VB cross section in FIG. 4A.

FIGS. 5A and 5B illustrate views of VA-VA cross section in FIG. 4A and VB-VB cross section in FIG. 4B, and illustrate the states where the trimming by a microblast has been performed. In the trimming process in this embodiment, a mask M is arranged above the resin layer B1 and the like and the blast is blown to them, but it may be configured that this mask M does not exist. Through this trimming process, regions that correspond to the trimming lines BR that constitute parts of the resin layer B1 and the opposing resin layer B2 are removed.

Further, it is preferable that the resin layer B1 and the opposing resin layer B2 are made of polyimide resin with a thickness that is equal to or more than 5 μm and is equal to or less than 20 μm, and the protective film PR is made of a film harder than the glass substrate G1 or the like such as SiC, Alumina, and Diamond-Like Carbon with a thickness that is equal to or more than 0.1 μm and is equal to or less than 1 μm, for example. Owing to the protective film PR, a crack due to the blast hardly occurs on the glass substrate G1 and the opposing glass substrate G2 and thus a breakage of the substrates is prevented. Even in the case where the polyimide resin slightly remains on the protective film PR, if the protective film PR is made of the materials as above, the cutting can be done in the cutting process performed later and a process margin can be secured. Further, in the trimming by the blast, a foreign substance could reattach to the resin layer B1, but the attachment is primarily made by a physical adhesive force, and the foreign substance can be removed by dry cleaning or wet cleaning with purified water.

Figure 6A:
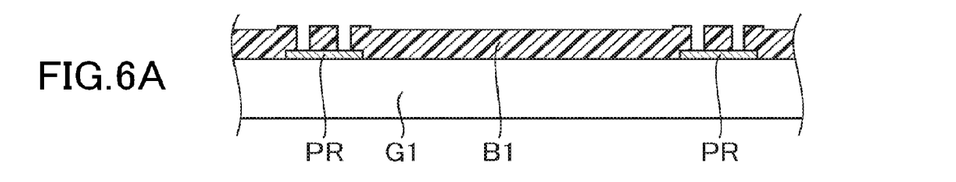
FIG. 6A is a view illustrating the manufacturing process of the display device according to the first embodiment.
Figure 6B:
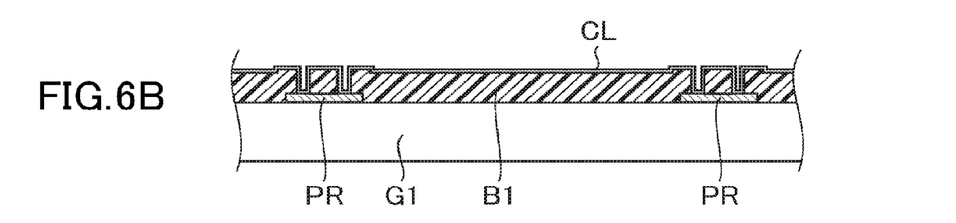
FIG. 6B is a view illustrating the manufacturing process of the display device according to the first embodiment.

Subsequently, the method of manufacturing according to this embodiment is explained with reference to FIGS. 6A to 7D. As illustrated in FIG. 6A, after the protective film PR is firstly formed in the first grid region GR1 on the glass substrate G1, the resin layer B1 of polyimide is formed so as to cover the protective film PR, and then the trimming by the blast is performed in the second grid region GR2. After that, as illustrated in FIG. 6B, the circuit layer CL including the organic electroluminescence element OL, the pixel circuit PX, the scanning signal line driving unit GDP and the like is formed on the resin layer B1, and then, as illustrated in FIG. 6C, laminating of the opposing resin layer B2 to which similar processing is applied is performed.

Figure 6C:
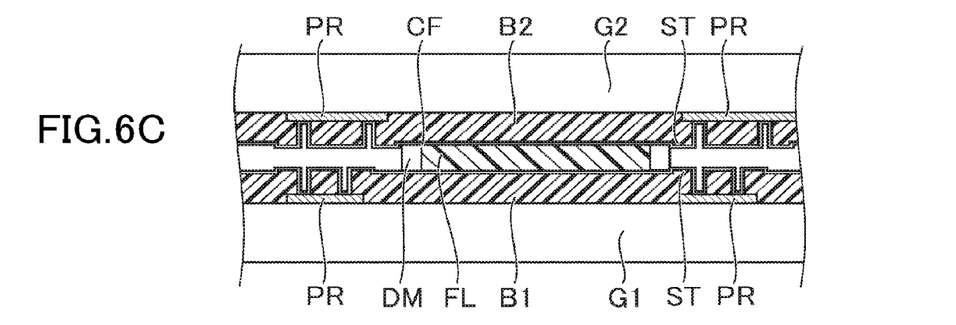
FIG. 6C is a view illustrating the manufacturing process of the display device according to the first embodiment.

In the process of laminating illustrated in FIG. 6C, the filling material FL is disposed inside the sealing material DM that is arranged in a rectangular form inside the protrusion portions ST generated by the protective film PR so as to avoid an overlap with the protrusion portions ST, and the filling material FL is cured by ultraviolet ray processing. The sealing material DM is formed inside the protrusion portions ST of both of the resin layer B1 side and the opposing resin layer B2 side so as to be in accordance with them, and the sealing material DM is disposed on the position where an overlap with the protection film PR can be avoided (to arrange the sealing material DM so as to avoid an overlap with the protrusion portions ST as well, it is preferable to dispose it with a certain distance from the protective film PR).

Figure 7A:
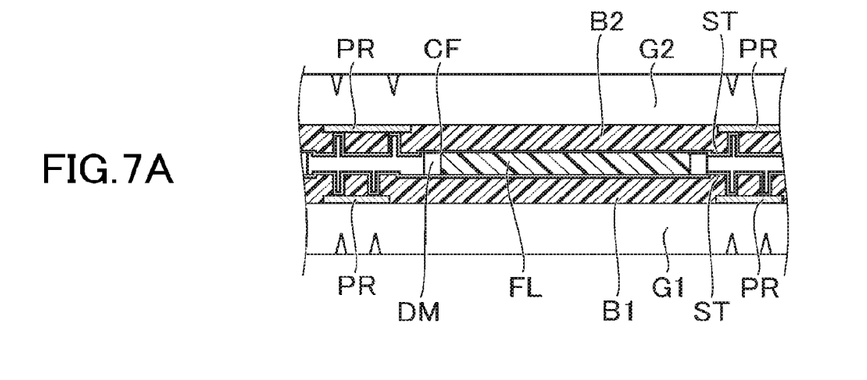
FIG. 7A is a view illustrating the manufacturing process of the display device according to the first embodiment.
Figure 7B:
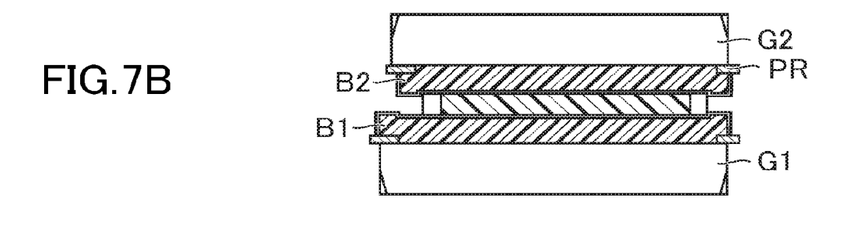
FIG. 7B is a view illustrating the manufacturing process of the display device according to the first embodiment.

Subsequently, as illustrated in FIG. 7A, after the resin layer B1 supported by the glass substrate G1 and the opposing resin layer B2 supported by the opposing glass substrate G2 are laminated to each other, the glass substrate B1 and the opposing glass substrate B2 are cut by performing scribe processing, and processing to individualize each product region is performed as illustrated in FIG. 7B. The scribe processing is applied to parts corresponding to the second grid region GR2 and the second opposing grid region GR4 that become line-like grooves formed by removing parts of the resin layer B1 and the opposing resin layer B2 by the trimming, and the glass substrate G1 and the opposing glass substrate G2 is cut at those parts. Further, when the glass substrate G1 is cut, the protective film PR is cut together.

Figure 7C:
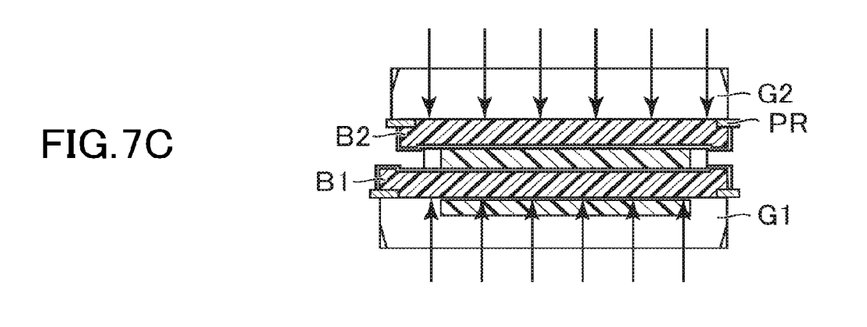
FIG. 7C is a view illustrating the manufacturing process of the display device according to the first embodiment.

After that, as illustrated in FIG. 7C, an ablation to peel the opposing glass substrate G2 off from the opposing resin layer B2 and an ablation to peel the glass substrate G1 off from the resin layer B1 are performed subsequently.

Figure 7D:
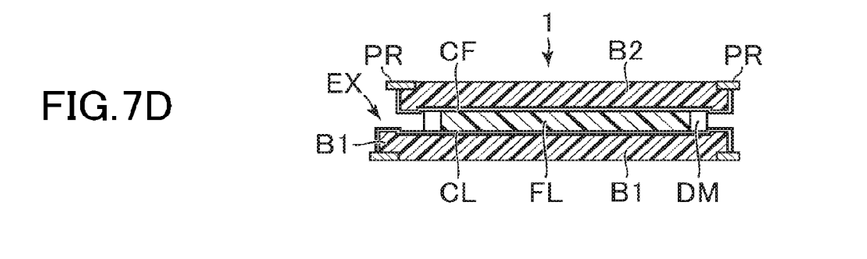
FIG. 7D is a view illustrating the manufacturing process of the display device according to the first embodiment.

In FIG. 7C according to this embodiment, an ablation using a laser with a wavelength of 308 nm is performed. Due to this, a pyrolysis occurs instantly on the resin layer B1 at the interface between the glass substrate G1 and the resin layer B1, and as illustrated in FIG. 7D, the glass substrate G1 and the like are peeled off.

In the case where Diamond-Like Carbon or Alumina that are materials that hardly absorb the wavelength of 308 nm are used for the protective film PR, a laser irradiation onto the resin layer B1 through the glass substrate G1 and the protection film PR is performed, and the pyrolysis occurs at the interface between the resin layer B1 and the glass substrate G1 and the interface between the resin layer B1 and the protective film PR. Thus, the protective film PR and the glass substrate G1 are peeled off from the resin layer B1 and the protective film PR can hardly remain on the display device 1. Further, in the case where SiC is used for the protective film PR, a laser irradiation onto the protective film PR and the resin layer B1 through the glass substrate G1 is performed, and the pyrolysis occurs at the interface between the resin layer B1 and the glass substrate G1 and the interface between the protective film PR and the glass substrate G1. Thus, the glass substrate G1 is peeled off from the resin layer B1 and the protective film PR and the protective film PR can easily remain on the display device 1. Moreover, in some cases the protective film PR remains in a form to protrude from the side of the resin layer B1 as illustrated in FIG. 7D and the like, and in other cases it remains in a form to be recessed at the side.

Second Embodiment

Subsequently, a method of manufacturing a display device according to a second embodiment of the present invention is explained.

Figure 8:
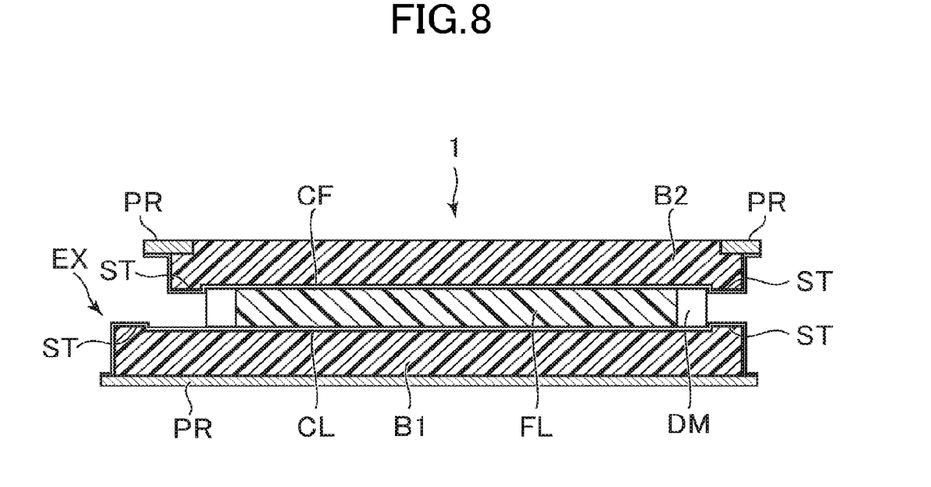
FIG. 8 is a view illustrating a lengthwise cross section of a display device according to a second embodiment.

FIG. 8 is a view illustrating the display device 1 manufactured by the method of manufacturing according to the second embodiment. As illustrated in this figure, in the method of manufacturing according to the second embodiment, the protective film PR on the side of the resin layer B1 that is provided with the circuit layer CL including a circuit to control a luminance of each unit pixel is formed so as to continuously cover the plurality of product regions and the first grid region on the glass substrate G1, and a state where the protective film PR remains on the resin layer B1 after the peeling of the glass substrate G1 by a laser ablation is illustrated. Further, it is profitable that a film that corresponds to the protective film PR is constituted by a laminated film of a laser separation film and a protective film on this laser separation film. The laser separation film is to be separated by absorbing laser light during the laser ablation of the glass substrate G1. Tungsten and Tantalum are appropriate as the material.

The method of manufacturing according to the second embodiment is almost the same with the method of manufacturing according to the first embodiment except for the points as above, and an explanation on the points that are almost the same is skipped. Further, in the method of manufacturing according to the second embodiment, it may be configured that the protective film PR remains on the resin layer B1, and it may also configured that the protective film PR does not remain on the resin layer B1. In the case where the protective film PR remains on the resin layer B1 as in FIG. 8, it is preferable that the display device 1 is a light emitting display device such as an organic electroluminescence display device. It is configured that upper, lateral, and lower surfaces of the resin layer B1 is surrounded by the circuit layer CL and the laminated film of the protective film PR and the laser separation film. For the circuit layer CL, there is a base film that is provided before a process of making a transistor layer. This base film is constituted by a laminated film of a silicon nitride film and a silicon oxide film. Since it is configured that the resin layer B1 is surrounded by this base film and the protective film PR, infiltration of moisture and Oxygen into the resin layer B1 is prevented. As a result, it becomes possible to prevent a damage to an organic light emitting element provided on the circuit layer CL by moisture or Oxygen. Note that in the first and second embodiments, a part of the protective film damaged by the blast processing is thinner than the other parts of the protective film.

In the first embodiment, the protective film PR is formed in the first grid region GR1 on the glass substrate G1, but the protective film PR may be formed as in the second embodiment, and the protective film PR may be formed all over the glass substrate G1. It is sufficient if the protective film PR is formed at least in the first grid region GR1.

In the above embodiments, as a display device, the organic EL display device 1 is explained that is provided with the organic electroluminescence element as an example, but the display device may also be a light emitting display device provided with a light emitting element such as a quantum-dot light emitting diode (QLED) for each pixel. Further, the application of the present invention is not limited to a light emitting display device, and the present invention is applied to a flexible display such as a liquid crystal display device.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A method of manufacturing a display device, the method comprising steps of:
preparing a glass substrate that corresponds to a plurality of product regions and a first grid region that surrounds each of the plurality of product regions and is grid-like;
forming a protective film that is harder than the glass substrate at least in the first grid region;
forming a resin layer continuously so as to cover the protective film and overlap with the plurality of product regions and the first grid region;
removing a part of the resin layer by blast processing in a second grid region that avoids the plurality of product regions, overlaps with the first grid region and surrounds each of the plurality of product regions;
forming a circuit layer that includes a circuit to control a luminance of each of a plurality of unit pixels that constitute an image on the resin layer;
cutting the glass substrate along lines that pass through the second grid region where the part of the resin layer is removed so as to separate each of the plurality of product regions; and
peeling the glass substrate off from the resin layer.

2. The method of manufacturing a display device according to claim 1,
wherein in the step of cutting the glass substrate, the protective film is also cut.

3. The method of manufacturing a display device according to claim 1,
wherein in the step of peeling the glass substrate off from the resin layer, the protective film is peeled off from the resin layer.

4. The method of manufacturing a display device according to claim 3,
wherein in the step of peeling the glass substrate off from the resin layer, laser light is irradiated onto the resin layer through the glass substrate and the protection film, and a laser ablation is made to occur on a surface of the resin layer that opposes to the glass substrate and the protective film.

5. The method of manufacturing a display device according to claim 1,
wherein in the step of peeling the glass substrate off from the resin layer, the glass substrate is peeled off from the protective film.

6. The method of manufacturing a display device according to claim 5,
wherein in the step of peeling the glass substrate off from the resin layer, laser light is irradiated onto the protective film and the resin layer through the glass substrate, and a laser ablation is made to occur on surfaces of the protective film and the resin layer that oppose to the glass substrate.

7. The method of manufacturing a display device according to claim 1,
wherein in the step of forming the protective film, the protective film is formed so as to continuously cover the plurality of product regions and the first grid region.

8. The method of manufacturing a display device according to claim 1,
wherein in the step of forming the protective film, the protective film is formed so as to avoid an overlap with a sealing material that surrounds an outer periphery of a display region where an image is displayed.

9. The method of manufacturing a display device according to claim 8,
wherein in the step of forming the resin layer, the resin layer is formed so as to include a first protrusion portion that is grid-like in accordance with a configuration of thickness of the protective film that protrudes from the glass substrate.

10. The method of manufacturing a display device according to claim 9, the method further comprising steps of:
preparing an opposing glass substrate;
laminating the opposing glass substrate onto a functional layer with an intervention of a filling material and the sealing material that surrounds the filling material, wherein the step of preparing the opposing glass substrate and the step of laminating the opposing glass substrate are performed prior to the step of cutting the glass substrate and the step of peeling the glass substrate off;
disposing the sealing material inside a region surrounded by the first protrusion portion that is grid-like, in the step of laminating the opposing glass substrate;
cutting the opposing glass substrate so as to separate the opposing glass substrate in correspondence with the plurality of product regions, in the step of cutting the glass substrate; and
peeling the opposing glass substrate off from an opposing resin layer.

11. The method of manufacturing a display device according to claim 10,
wherein the opposing glass substrate corresponds to a plurality of opposing product regions and a first opposing grid region that surrounds each of the plurality of opposing product regions and are grid-like, and wherein the step of preparing the opposing glass substrate further comprises steps of:

forming an opposing protective film that is harder than the opposing glass substrate at least in the first opposing grid region;

forming an opposing resin layer continuously in the plurality of opposing product regions and the opposing first grid region so as to cover the opposing protective film; and removing a part of the opposing resin layer by blast processing in a second opposing grid region that avoids the plurality of opposing product regions, overlaps with the first opposing grid region and surrounds each of the plurality of opposing product regions.

12. The method of manufacturing a display device according to claim 11, wherein in the step of forming the opposing resin layer, the opposing resin layer is formed so as to include a second protrusion portion that is grid-like in accordance with a configuration of thickness of the opposing protective film that protrudes from the opposing glass substrate.

13. The method of manufacturing a display device according to claim 12, wherein in the step of laminating the opposing glass substrate, the sealing material is disposed inside a region surrounded by the second protrusion portion of the opposing glass substrate that is grid-like.

* * * * *